United States Patent
Chen et al.

(10) Patent No.: US 12,113,013 B2
(45) Date of Patent: Oct. 8, 2024

(54) DUAL COLOR VIA PATTERNING

(71) Applicant: International Business Machines Corporation, Armonk, NY (US)

(72) Inventors: Hsueh-Chung Chen, Cohoes, NY (US); Yann Mignot, Slingerlands, NY (US); Su Chen Fan, Cohoes, NY (US); Mary Claire Silvestre, Clifton Park, NY (US); Chi-Chun Liu, Altamont, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 329 days.

(21) Appl. No.: 17/483,922

(22) Filed: Sep. 24, 2021

(65) Prior Publication Data
US 2023/0100368 A1    Mar. 30, 2023

(51) Int. Cl.
*H01L 23/522* (2006.01)
*H01L 21/768* (2006.01)
*H01L 23/532* (2006.01)

(52) U.S. Cl.
CPC .... *H01L 23/5226* (2013.01); *H01L 21/76807* (2013.01); *H01L 21/76883* (2013.01); *H01L 23/53228* (2013.01); *H01L 23/53257* (2013.01)

(58) Field of Classification Search
CPC .......... H01L 23/5226; H01L 23/53228; H01L 23/53257; H01L 21/76807; H01L 21/76883
USPC ........................................................ 257/530
See application file for complete search history.

(56) References Cited

U.S. PATENT DOCUMENTS

| | | |
|---|---|---|
| 5,686,354 A | 11/1997 | Avanzino |
| 6,867,073 B1 | 3/2005 | Enquist |
| 8,114,769 B1 | 2/2012 | Srivastava |
| 8,782,571 B2 | 7/2014 | Sun |
| 9,330,965 B2 | 5/2016 | Chen |
| 9,385,078 B1 | 7/2016 | Feurprier |
| 9,396,966 B1 | 7/2016 | Yang |
| 9,646,881 B2 | 5/2017 | Bruce |
| 9,786,597 B2 | 10/2017 | Chang |
| 9,805,972 B1 | 10/2017 | Zhang |
| 10,020,254 B1 | 7/2018 | Bao |
| 10,020,255 B1 | 7/2018 | Bao |
| 10,199,264 B2 | 2/2019 | Zhang |
| 2007/0134917 A1 | 6/2007 | Li |
| 2015/0001735 A1 | 1/2015 | Mignot |
| 2023/0035496 A1* | 2/2023 | Wilfing ............. H01L 23/49822 |

OTHER PUBLICATIONS

Sara Paolillo et al., "Direct metal etch of ruthenium for advanced interconnect," Journal of Vacuum Science & Technology B, vol. 36, No. 3, May 2018, 03E103, pp. 1-9.

\* cited by examiner

*Primary Examiner* — Tu-Tu V Ho
(74) *Attorney, Agent, or Firm* — L. Jeffrey Kelly; Otterstedt & Kammer PLLC

(57) ABSTRACT

A device includes: a first dielectric material; a first metal line in the first dielectric material; a second dielectric material disposed on the first dielectric material and the first metal line; a second metal line in the second dielectric material; and a plurality of metal vias disposed on a same level and connecting the first metal line and the second metal line, wherein the plurality of metal vias comprise a first top via and a bottom via having different sidewall profile angles.

20 Claims, 5 Drawing Sheets

DUAL COLOR VIA PATTERNING

BACKGROUND

As integrated circuit technology improves and process size decreases, building metal interconnect structures that are used to wire transistors together becomes more challenging. Design rules for metal lines are typically based on scaling a pitch dimension that assumes a regular pattern of equal line widths and spacings between the metal lines at each metal layer. Metal line widths are generally expected to shrink with every new process generation to further improve integrated circuit performance.

Within these metal interconnect structures, vias vertically connect stacked metal lines to one another. Typically, smaller vias incur higher via resistance, causing resistance-capacitance (RC) delays to worsen. In addition, smaller via footprints cause the via aspect ratio, i.e., the ratio of height to width, to increase, making the vias taller and narrower, and therefore more difficult to fill with metal. Thus, for multiple reasons, it is advantageous for via footprints to remain large, while metal lines continue to shrink with each technology generation.

Moreover, via placement can be a challenge with, for example, double via patterning using memorization stacks, chamfer shape, metal reactive ion etching (RIE) lag (of the aspect ratio dependent etching), etc.

Furthermore, for smaller process sizes (e.g., below 10 nanometer (nm) processes), dual damascene interconnect structures are subject to stress, metal flopover, etc. In some cases, a floorplan and design of the interconnect structures may by constrained by a chosen integration scheme. Further, copper based schemes are believed to have roadblocks based on RC delay.

BRIEF SUMMARY

According to an embodiment of the present invention, a device includes a first dielectric material; a first metal line in the first dielectric material; a second dielectric material disposed on the first dielectric material and the first metal line; a second metal line in the second dielectric material; and a plurality of metal vias disposed on a same level and connecting the first metal line and the second metal line, wherein the plurality of metal vias comprise a first top via and a bottom via having different sidewall profile angles.

According to an embodiment of the present invention, a device includes a first dielectric material; a first metal line in the first dielectric material; a second dielectric material disposed on the first dielectric material and the first metal line; a second metal line in the second dielectric material; and a plurality of metal vias having a same height and connecting the first metal line and the second metal line, wherein the plurality of metal vias comprise a first top via and a bottom via having inverse sidewall profile angles.

According to embodiments of the present invention, a method of manufacturing a device includes providing a substrate; forming a trench in the substrate; depositing a first metal in the trench by a first metallization; patterning the first metal to form a first metal via by a first color definition; depositing a second dielectric material over the substrate and the first metal; patterning the second dielectric material to form a second trench and a second via using a second color definition, wherein the second trench exposes at least a portion of the first metal via, and the second via exposes a portion of the first metal; and depositing a second metal in the second trench and the second via by a second metallization to form a second metal via.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware mod-ule(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. Some embodiments may not have these potential advantages and these potential advantages are not necessarily required of all embodiments. For example, one or more embodiments may provide for:

- top via and bottom via formed on a same via level using respective single color via masks;
- improved RC delay due to reduced via height and short metal connections;
- top via and bottom via formed on a same via level without the use of two color (or more) via masks;
- chamfer sidewall profile angles of top via and bottom via having inverse shapes enabling decreased distances between the vias.

These and other features and advantages of the present invention will become apparent from the following detailed description of illustrative embodiments thereof, which is to be read in connection with the accompanying drawings.

BRIEF DESCRIPTION OF THE DRAWINGS

Preferred embodiments of the present invention will be described below in more detail, with reference to the accompanying drawings.

DETAILED DESCRIPTION

According to embodiments of the present invention, a method of manufacturing a device includes a patterning of a first set of vias is performed by a subtractive etch with a first via profile and critical-dimension (CD), and a patterning a second set of vias by a dual-damascene process with a second via profile and CD. According to some embodiments, the first set of vias are formed as a unitary piece with a first metal level of the device and the second set of vias are formed as a unitary piece with a second metal level of the device. According to some embodiments, a metal material of the first via can be different than a metal material of the second via.

As used herein, "color" refers to the use of a photo mask with a patterns. According to some embodiments, dual or multi color refers to the use of different photo masks with different patterns, where the resists used in each step can be made of the same or different materials and can be sensitive to the same or different wavelengths of light. Typically, a multi color process includes consecutive lithographic and etch steps that "memorize" a specific mask color onto a mask. Following multiple memorization processes, the defined pattern is transferred into a lower layer (i.e., a device layer), where the multi color via are formed. As is well-known to the skilled artisan in the field of integrated circuit fabrication, photolithography uses light to transfer a geometric pattern from a photomask to a light-sensitive chemical photoresist, or resist, on a substrate.

Example embodiments of the present invention enable one or more of, multiple via patterning at a same level by two or more single color mask processes, multiple via patterning at different levels, elimination of the memorization layer (typically used in creating a via in a conventional method) that are color dependent. The memorization layer is typically a metal layer used as an etch mask to confine vias within a trench pattern during a partial etch process and followed by a trench dielectric etch.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling 1st Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Given the discussion thus far, it will be appreciated that, according to some embodiments of the present invention, a dual color via patterning method 100 (see FIG. 1) can be include, at step 101, providing a substrate formed of a first dielectric material (e.g., an interlevel dielectric (ILD)); at step 102, forming a first trench in the substrate; at step 103, depositing a first metal in the first trench by a first metallization; and at step 104, patterning the first metal to form a first top via by a first color definition. The method further includes, at step 105, depositing a second dielectric material; at step 106, patterning the second dielectric material to form a second trench and second via using a second color definition; and at step 107, depositing a second metal by a second metallization. According to an example embodiment, at step 107, the second metallization fills the second trench and the second via with a second metal. According to one or more embodiments, the second via can have a different profile angle than the first via, based on the etch sequences According to some embodiments of the present invention, the method further includes, at step 108, forming a second top via by a third patterning of the second metal.

Figure 1:
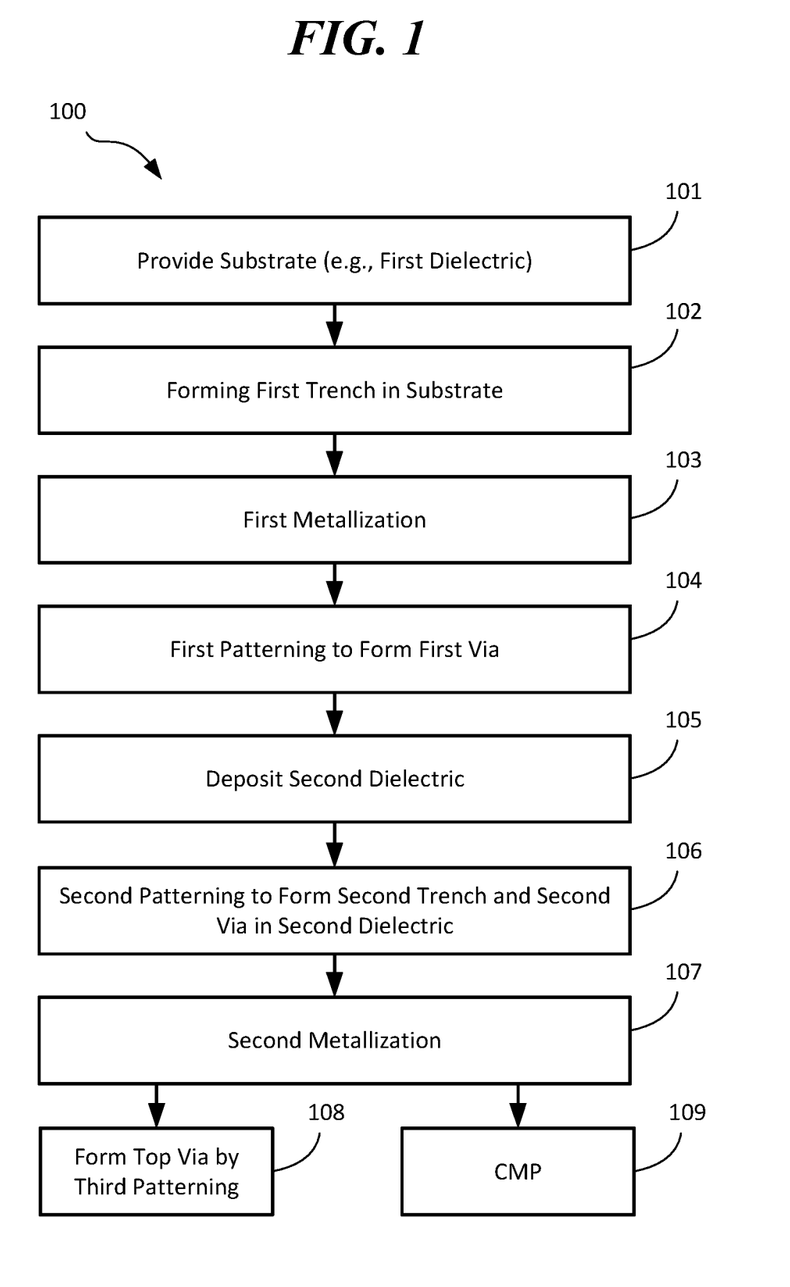
FIG. 1 is method of dual color via patterning according to one or more embodiments of the present invention.

According to some embodiments of the present invention, the method further includes, at step 109, a chemical-mechanical polish (CMP), or the like, to create an inlaid structure.

According to some embodiments, the steps of forming the second top via (see step 108) and the CMP (see step 109) are mutually exclusive.

Figure 2:
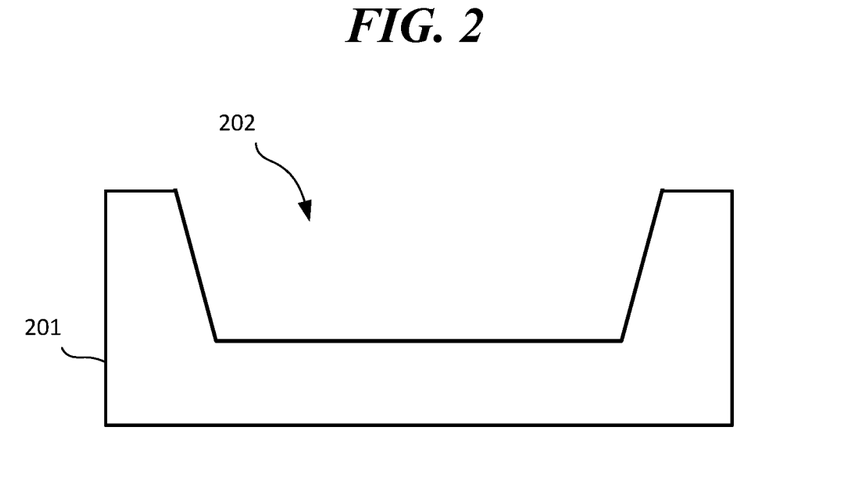
FIGS. 2-8 are cross-section views of a dual-damascene device at different steps in a manufacturing process according to one or more embodiments of the present invention.
Figure 3:
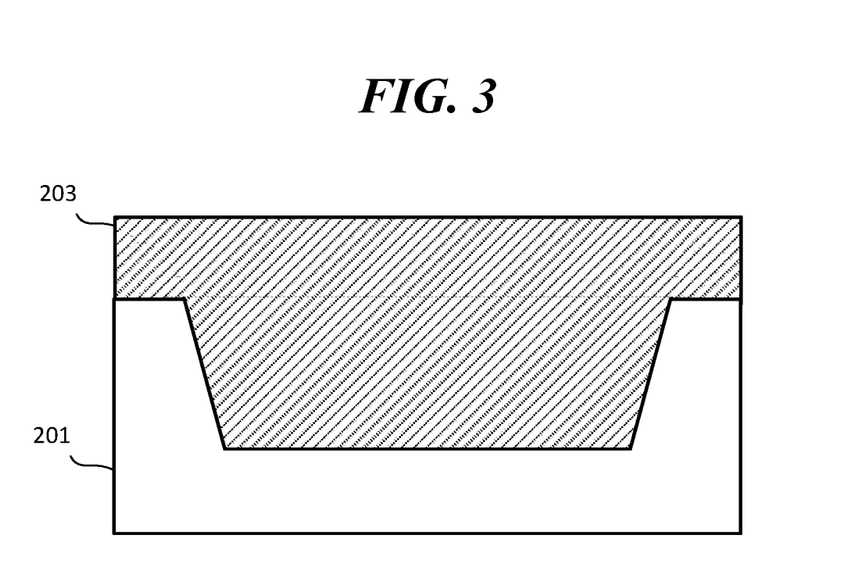
Figure 4:
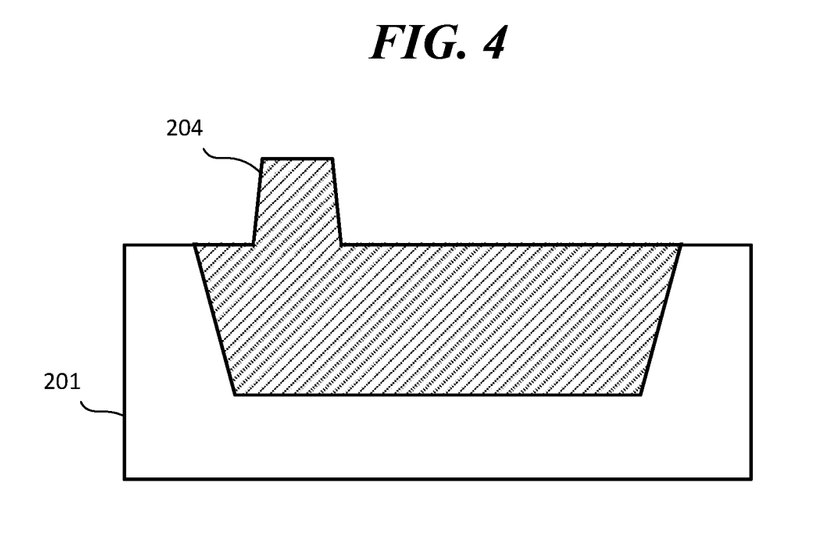
Figure 5:
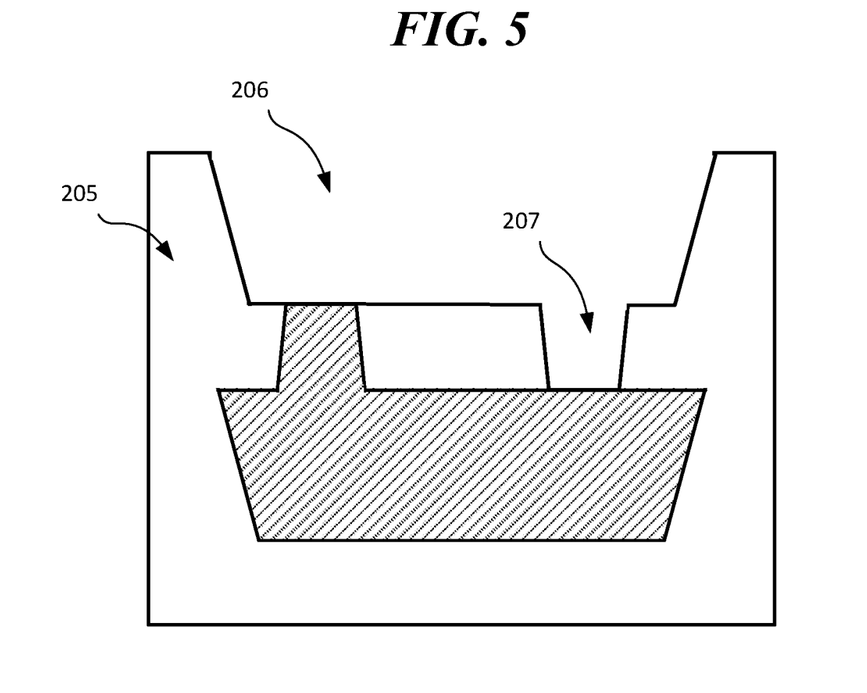
Figure 6:
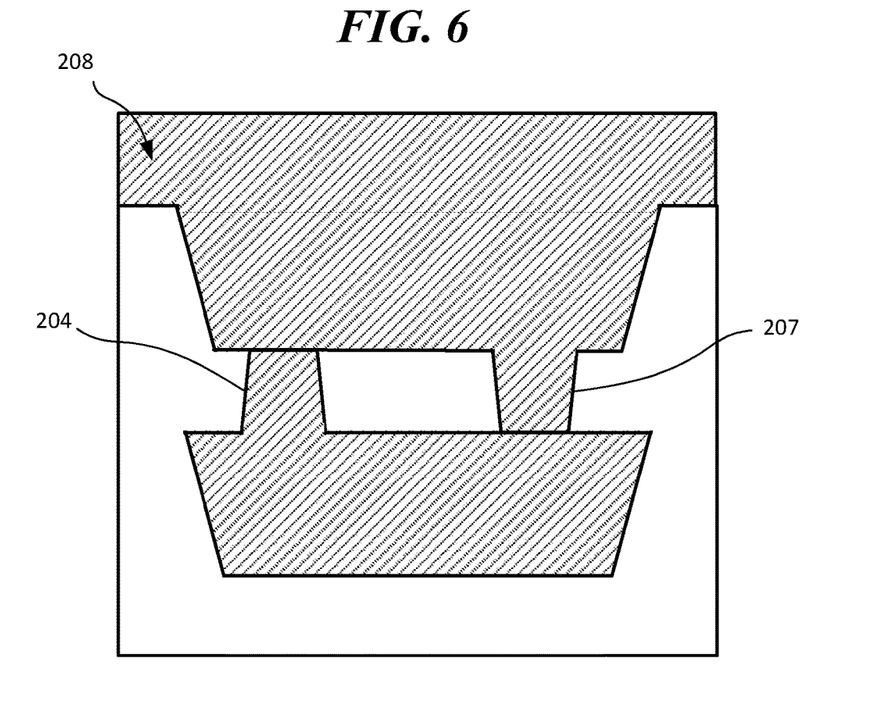
Figure 7:
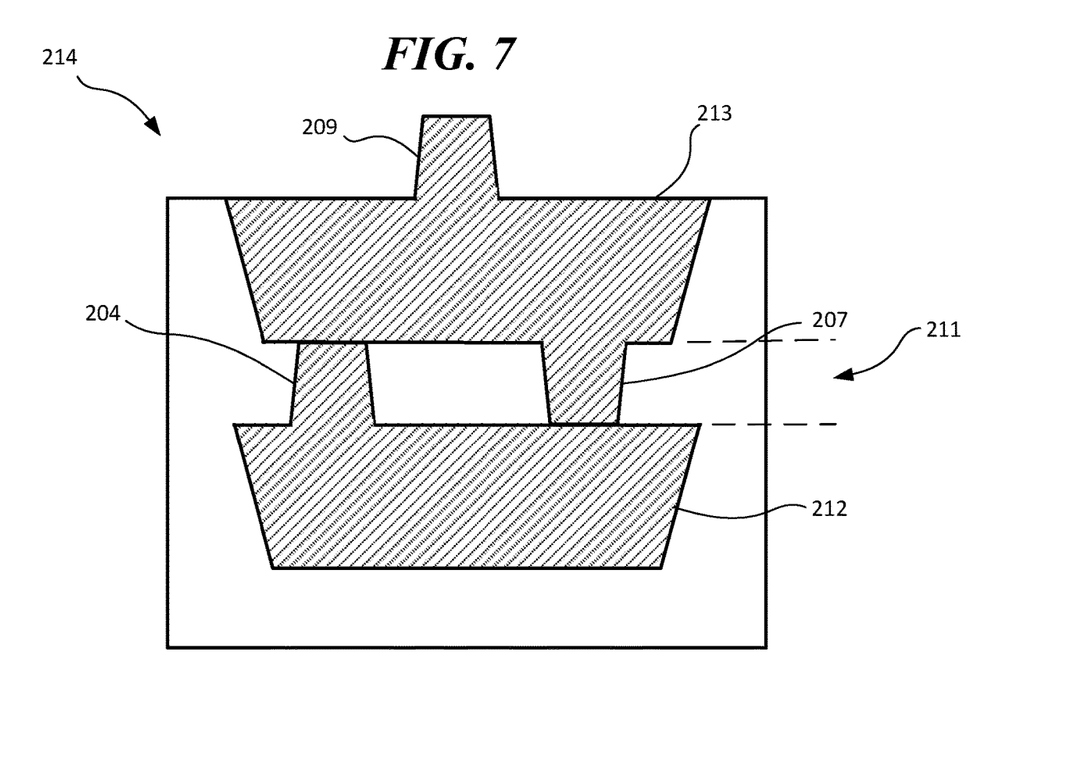
Figure 8:
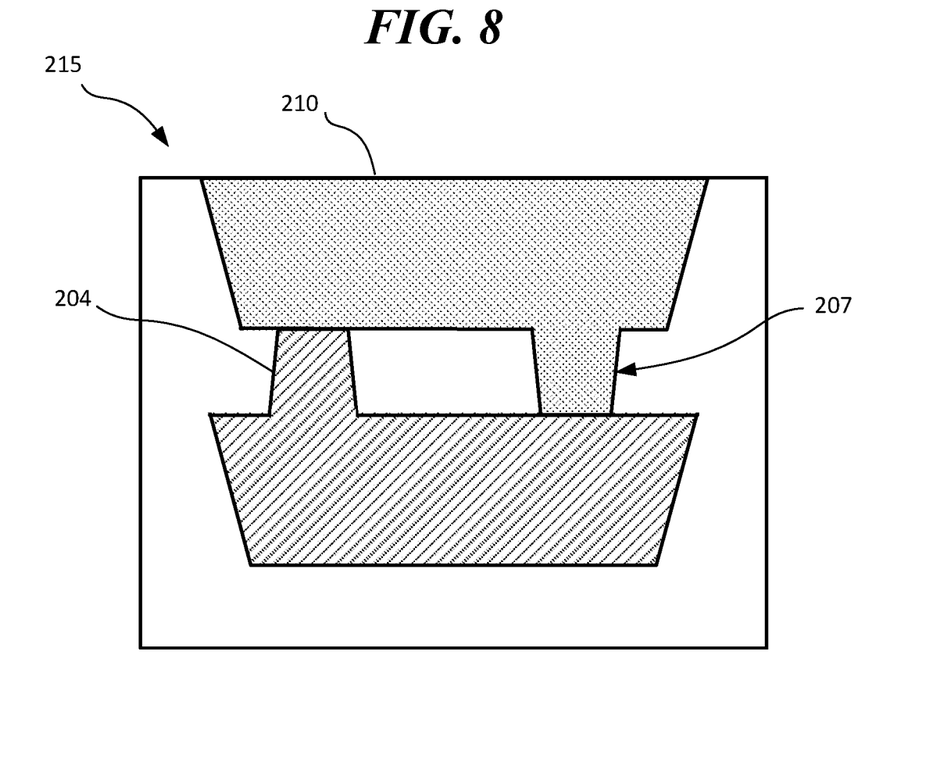

FIGS. 2-8 illustrate embodiments of the methods of FIG. 1 for manufacturing a dual damascene device (see for example, device 214, FIG. 7 and device 215, FIG. 8). As shown in FIG. 2, a substrate, formed of a first dielectric material 201, is provided and a trench 202 is formed in the substrate. As shown in FIG. 3, a first metallization process deposits a first metal 203. According to some embodiments, the first metal 203 is etchable, wherein the first metal 203 can be, for example, tungsten (W), aluminum (Al), Ruthenium (Ru), Molybdenum (Mo), Titanium (Ti), or Hafnium (Hf). As shown in FIG. 4, a first metal via 204, which is a top via, is formed by a first color via patterning of the first metal. According to some example embodiments, an etch algorithm can be used to stop the subtractive metal etch, for example, using End-Point Detection, since the open area is largely landing on oxide. As shown in FIG. 5, a second dielectric material 205 is deposed on the substrate, and the second dielectric material 205 is patterned to form a second trench 206 and second via 207 using a dual damascene scheme According to some embodiments, the patterning of the second dielectric material forms the second trench and the second via according to the dual damascene scheme, wherein the second trench exposes at least a portion of the first metal via, and the second via exposes a portion of the first metal. As shown in FIG. 6, a second metal 208 is deposited by a second metallization; the second metallization fills a second via 207, which is a bottom via, which has a different sidewall profile angle than the first via 204. As shown in FIG. 7, a third metal via 209, which is a top via similar to the first metal via 204, is formed by a third patterning (see step 108) to form the device 214.

According to at least one embodiments, the first metal via 204, the second via 207, and the third metal via 209 are formed by individual via patterning by single color mask processes, thereby eliminating the need for double patterning memorization.

According to some embodiments of the present invention, the first dielectric material 201 and the second dielectric material 205 can be formed of Tetraethylorothosilicate oxide (TEOS), an ultra low-k dielectric (ULK), Octamethylcyclotetrasiloxane (OMCTS), etc., which can be formed by Chemical Vapor Deposition (CVD), Physical Vapor Deposition (PVD), etc. According to some embodiments, the first dielectric material 201 and the second dielectric material 205 can be formed of different materials from one another.

According to some embodiments of the present invention, the first metal and the second metal can be the same metal as shown in FIG. 7, or different metals as shown in FIG. 8 (e.g., W to form a lower level including the first via 204, and copper (Cu) to form an upper level including the second via 207). According to some embodiments of the present invention, in the device 214 of FIG. 7, the second metal 208 is an etchable metal, such as such as W, Al, Ru, Mo, Ti, Hf, etc.

According to example embodiments, the first via 204 and the second via 207 are formed at a same via level 211. Further, according to some embodiments, the first via 204 is a top via and the second via 207 is a bottom via, where the top via and the bottom via have different sidewall profile angles. According to example embodiments, the sidewall profile angles of the bottom via and the top via are inverse (i.e., about a vertical plane). According to some embodiments, for a photolithography process having an infinite mask selectivity and assuming perfect verticality of plasma, a mask can erode, resulting in a sloped sidewall profile, which is correct for dual damascene and subtractive schemes.

According to some embodiments, the profile angle for the top via 204 is defined by a subtractive etch of the first metal 203 and a profile angle of the bottom via 207 is the result of a dual damascene scheme where the second dielectric material 205 is formed by an etch using with a via mask, and then metalized. According to one or more embodiments, a distance between a top via and a bottom via can be improved (e.g., reduced) in a device with vias having inverse sidewall profile angles.

According to one or more embodiments, the first metal deposited in the first trench forms a first metal line 212 and the second metal deposited in the second trench forms a second metal line 213.

According to some embodiments, the first metal line 212 and the top via 204 are a first unitary metal structure, and the second metal line 213 and the bottom via 207 are a second unitary metal structure.

Referring to FIG. 8, according to some embodiments, the second metal 208 can be planarized by a CMP process, or the like, to create an inlaid structure 210 of the device 215.

Figure 9:
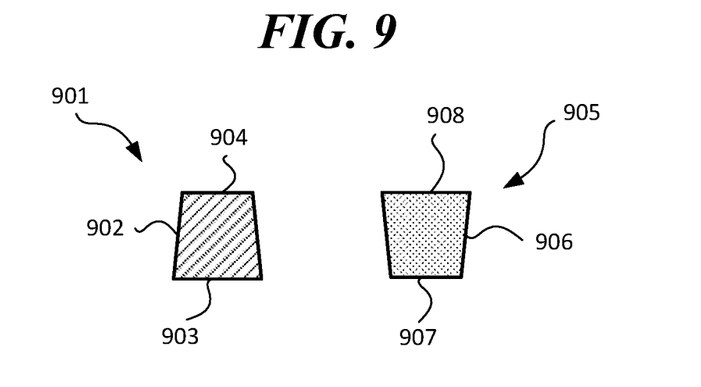
FIG. 9 is a diagram for top and bottom vias according to an embodiments of the present invention.

According to example embodiments, the sidewall profile angle of the top via, formed by a subtractive etch, is less than the sidewall profile angle of the bottom via (measured from a vertical plane). According to embodiments of the present invention, and referring to FIG. 9, top vias, e.g., 901, have sidewalls, e.g., 902, angled from a relatively wide base 903 to a relatively narrow top 904 (i.e., a length of the base 903 is greater than a length of the top 904), and bottom vias, e.g., 905, have sidewalls, e.g., 906, angled from a relatively narrow base 907 to a relatively wide top 908 (i.e., a length of the base 907 is less than a length of the top 908).

According to example embodiments, the formation of a bottom via and a top via at the same interconnect level increases the design flexibility by allowing, for example, a reduced space between the vias. According to some embodiments, methods do not require a multi memorization layer to transfer the different via color to the device layers.

According to example embodiments, the dual vias on the same level enable devices with reduced height vias (from about 5 to 20 nm) and short metal connections (from about 5 to 20 nm). According to some embodiments, RC performance can be improved by about 0.5 to 2%, resulting from improved middle-of-line (MOL) resistance. According to at least one embodiments, RC performance can be improved by about 2%, resulting from improved middle-of-line (MOL) resistance.

According to some embodiments, the top via and the bottom via formed on a same via level, and a via distance between the top via and the bottom via, center-to-center, can be reduced as the vias are not formed in a same process step and a risk of merger during the double patterning memorization and pattern transfer into the dielectric is reduced or eliminated. According to some embodiments, in a design with the top via and the bottom via formed on the same via level, design flexibility can be increased without the need to use of a multi via color masks for vias on specific levels.

Recapitulation:

According to embodiments of the present invention, a method 100 of manufacturing a device includes, at step 101, providing a substrate; at step 102, forming a trench in the substrate; at step 103, depositing a first metal in the trench by a first metallization; at step 104, patterning the first metal to form a first metal via by a first color definition; at step 105, depositing a second dielectric material over the substrate and the first metal; at step 106, patterning the second dielectric material to form a second trench and a second via using a second color definition, wherein the second trench exposes at least a portion of the first metal via, and the second via exposes a portion of the first metal; and at step 107, depositing a second metal in the second trench and the second via by a second metallization to form a second metal via.

According to an embodiment of the present invention, a device includes a first dielectric material 201; a first metal line 212 in the first dielectric material; a second dielectric material 205 disposed on the first dielectric material and the first metal line; a second metal line 213 in the second dielectric material; and a plurality of metal vias disposed on a same level 211 and connecting the first metal line and the second metal line, wherein the plurality of metal vias comprise a first top via 204 and a bottom via 207 having different sidewall profile angles.

According to an embodiment of the present invention, a device includes a first dielectric material 201; a first metal line 212 in the first dielectric material; a second dielectric material 205 disposed on the first dielectric material and the first metal line; a second metal line 213 in the second dielectric material; and a plurality of metal vias having a same height and connecting the first metal line and the second metal line, wherein the plurality of metal vias comprise a first top via 204 and a bottom via 207 having inverse sidewall profile angles.

The terminology used herein is for the purpose of describing particular embodiments only and is not intended to be limiting of the invention. As used herein, the singular forms "a," "an" and "the" are intended to include the plural forms as well, unless the context clearly indicates other-wise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device comprising:
a first dielectric material;
a first metal line in the first dielectric material;
a second dielectric material disposed on the first dielectric material and the first metal line;
a second metal line in the second dielectric material, wherein the first metal line and the second metal line have angled sidewalls; and
a plurality of metal vias disposed on a same level and connecting the first metal line and the second metal line, wherein the plurality of metal vias comprise a first top via and a bottom via having different sidewall profile angles.

2. The device of claim 1, wherein the first metal line and the second metal line comprise a same metal.

3. The device of claim 1, wherein at least one of the first metal line and the second metal line comprises an etchable metal.

4. The device of claim 1, wherein the first metal line and the second metal line comprise different metals.

5. The device of claim 1, wherein the first top via and the bottom via have a height between about 5 to 50 nanometers.

6. The device of claim 1, wherein the first top via comprises:
a base having a first length; and
a top having a second length,
wherein the first length is greater than the second length, and the top of the first top via contacts a bottom of the second metal line, and a sidewall of the first top via extends between the base of the first top via and the top of the first top via and defines a sidewall profile angle of the first top via.

7. The device of claim 1, wherein the bottom via comprises:
a base having a first length; and
a top having a second length,
wherein the first length is less than the second length, and the base of the bottom via contacts a top of the first metal line, wherein a sidewall of the bottom via extends between the base of the bottom via to the top of the bottom via and defines a sidewall profile angle of the bottom via.

8. The device of claim 1, wherein the first top via extends above a surface of the first dielectric material.

9. The device of claim 1, further comprising a second top via disposed on a top of the second metal line.

10. The device of claim 9, wherein the second top via extends above a surface of the second dielectric material.

11. A device comprising:
a first dielectric material;
a first metal line in the first dielectric material;
a second dielectric material disposed on the first dielectric material and the first metal line;
a second metal line in the second dielectric material, wherein the first metal line and the second metal line have angled sidewalls; and
a plurality of metal vias having a same height and connecting the first metal line and the second metal line,
wherein the plurality of metal vias comprise a first top via and a bottom via having inverse sidewall profile angles.

12. The device of claim 11, wherein the first top via and the bottom via are separated by a portion of the second dielectric material.

13. The device of claim 11, wherein the height of the first top via and the bottom via is between about 5 to 50 nanometers.

14. The device of claim 11, wherein the first top via comprises:
a first base having a first length; and a first top having a second length, wherein the first length is greater than the second length, and the first top of the first top via contacts a bottom of the second metal line, and a sidewall of the first top via extends between the first base and the first top and defines a first sidewall profile angle of the first top via; and wherein the bottom via comprises:

a second base having a third length; and a second top having a fourth length, wherein the third length is less than the fourth length, and the second base of the bottom via contacts a top of the first metal line, wherein a sidewall of the bottom via extends between the second base and the second top and defines a second sidewall profile angle of the bottom via.

15. The device of claim 11, further comprising a second top via extending from a top of the second metal line.

16. The device of claim 15, wherein the second top via comprises:

a base having a first length; and a top having a second length, wherein the first length is greater than the second length, and a sidewall of the second top via extends between the base and the top and defines a sidewall profile angle of the second top via.

17. A method of manufacturing a dual damascene device comprising:

providing a substrate;

forming a trench in the substrate;

depositing a first metal in the trench by a first metallization;

patterning the first metal to form a first metal via by a first color definition;

depositing a second dielectric material over the substrate and the first metal;

patterning the second dielectric material to form a second trench and a second via using a second color definition, wherein the second trench exposes at least a portion of the first metal via, and the second via exposes a portion of the first metal; and depositing a second metal in the second trench and the second via by a second metallization to form a second metal via.

18. The method of claim 17, further comprising patterning the second metal to form a third metal via extending from a top surface of the second metal.

19. The method of claim 17, wherein the patterning of the first metal comprises forming a first sidewall of the first metal via angled from a base of the first metal via to a top of the first metal via, wherein the base of the first metal via is wider than the top of the first metal via, and the top of the first metal via contacts the second metal, and wherein the patterning of the second dielectric material to form the second via defines a second sidewall of the second metal via angled from a base of the second metal via to a top of the second metal via, wherein the base of the first metal via is narrower than the top of the first metal via, the base of the second metal via contacts the first metal.

20. The method of claim 19, wherein the first sidewall and the second sidewall have inverse sidewall profile angles.

* * * * *